United States Patent [19]

Young et al.

[11] Patent Number: 5,596,486

[45] Date of Patent: * Jan. 21, 1997

[54] HERMETICALLY SEALED MEMORY OR PC CARD UNIT HAVING A FRAME, HEADER AND COVERS IN BONDED ENGAGEMENT

[75] Inventors: Paul R. Young, Cromwell; David W. Richard, Southington; Leonard Bazar, Middletown, all of Conn.

[73] Assignee: Kaman Aerospace Corporation, Bloomfield, Conn.

[*] Notice: The term of this patent shall not extend beyond the expiration date of Pat. No. 5,457,606.

[21] Appl. No.: 318,507

[22] Filed: Oct. 5, 1994

Related U.S. Application Data

[63] Continuation-in-part of Ser. No. 150,497, Nov. 10, 1993, abandoned, and Ser. No. 178,385, Dec. 23, 1993, Pat. No. 5,457,606.

[51] Int. Cl.$^6$ .............................. H05K 1/18; H05K 5/06; H01R 13/58; H01R 23/70
[52] U.S. Cl. ........................ 361/737; 235/487; 235/492; 361/684; 361/772; 361/829; 439/62; 439/449; 439/629; 439/651
[58] Field of Search .................... 174/52.1; 206/328; 235/492, 487; 257/678, 679; 361/684, 728, 736, 737, 752, 786, 772, 785, 787, 789, 816, 818, 829; 439/59, 62, 76, 78, 82, 83, 79, 80, 629, 630, 636, 637, 638, 651, 937, 449, 452, 460, 474, 377

[56] References Cited

U.S. PATENT DOCUMENTS

| | | | |
|---|---|---|---|
| 4,941,841 | 7/1990 | Darden et al. | 439/377 |
| 5,061,845 | 10/1991 | Pinnavaia | 235/492 |
| 5,070,032 | 12/1991 | Yuan et al. . | |
| 5,095,344 | 3/1992 | Harari . | |
| 5,107,073 | 4/1992 | Steffen | 174/52.1 |
| 5,168,465 | 12/1992 | Harari . | |
| 5,172,338 | 12/1992 | Mehrotra et al. . | |
| 5,173,840 | 12/1992 | Kodai et al. | 361/737 |
| 5,184,209 | 2/1993 | Kodai et al. | 257/679 |
| 5,198,380 | 3/1993 | Harari . | |
| 5,200,959 | 4/1993 | Gross et al. . | |
| 5,279,623 | 1/1994 | Watanabe et al. | 437/220 |
| 5,313,364 | 5/1994 | Omori et al. | 361/737 |
| 5,457,606 | 10/1995 | Young et al. | 361/737 |

OTHER PUBLICATIONS

IFEE Transactions On Components, Hybrids, and Manufacturing Technology "Large Area Hybrid Module" vol. chmt—No. 4 Dec. 1981.
J. Comer, Gage Publishing Company;" Applying Glass–to–Metal Seals"; published 1958; Electronic Manufacture.
Sundisk "Ink Development Pen Software for AT&T EO Personal Communicator will be Sold on Sundisk Flash Storage Cards"; Jun. 30, 1993.
Sundisk "Sundisk to Provide Flash Storage Cards for HP 100LX"; May 4, 1993.
Sundisk; Sundisk Flash Storage Cards Designed into Zoomer PDS; High Capacity Cards are "Plug and Play"; Jun. 3, 1993.
Sundisk; Sundisk Material; Feb. 1993.
Sundisk; "Sundisk Solid–Sass Storage Technology"; May, 1993.
Personal Computer Memory Card International Assocation; Advertising Information "Release Record"; Nov. 1992.

*Primary Examiner*—Donald A. Sparks
*Attorney, Agent, or Firm*—Fishman, Dionne & Cantor

[57] ABSTRACT

An improved PC Card element, particularly a PC card unit, is presented in which the unit is hermetically sealed. The unit has a metallic frame, a metallic header with glass or ceramic encapsulated through pins, and opposed outer metallic covers, all of the metallic elements being welded together to form a hermetically sealed unit. The metallic frame and header is preferably formed as a single piece, i.e., unitary part, either by casting and machining or by metal injection molding.

84 Claims, 8 Drawing Sheets

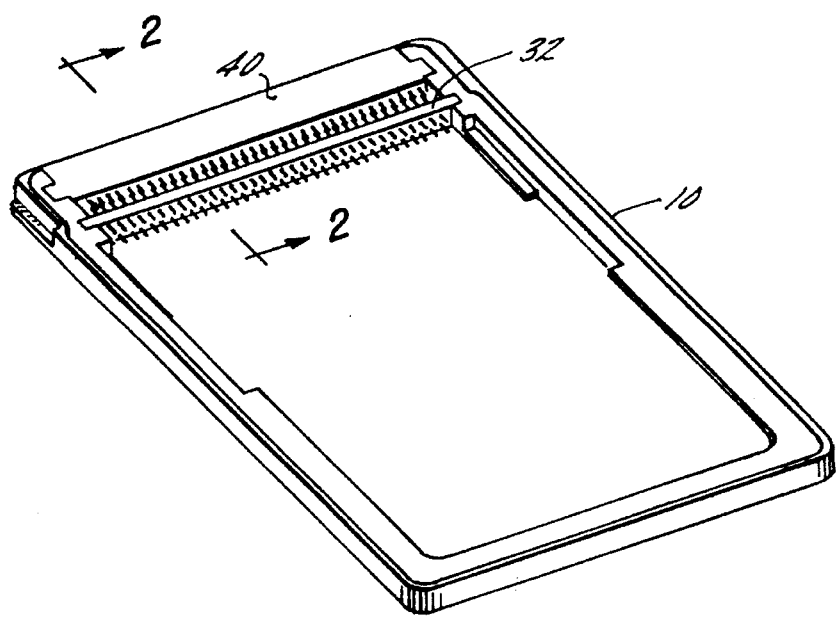
FIG. 1
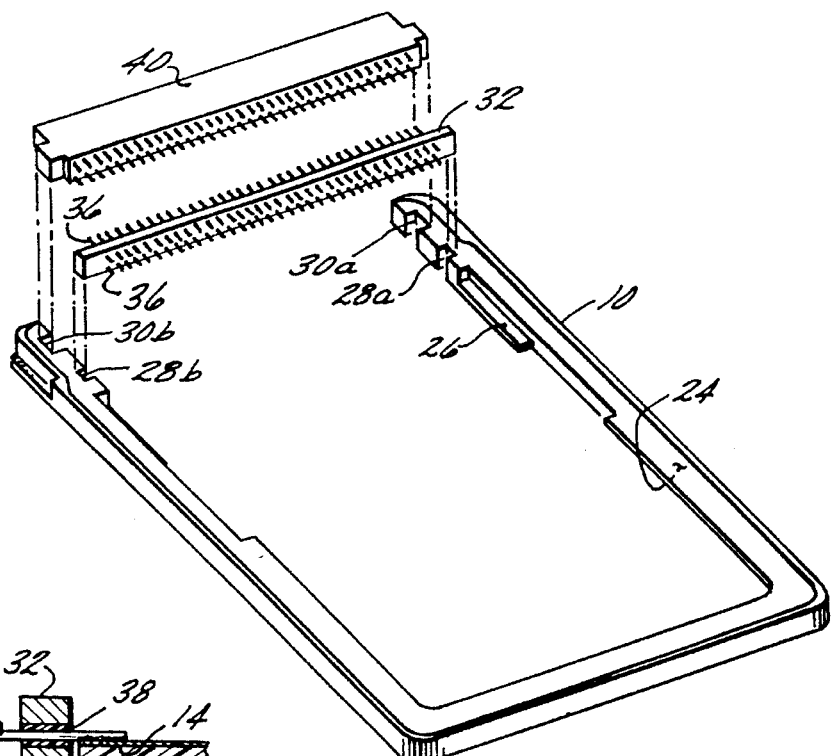
FIG. 2
FIG. 3

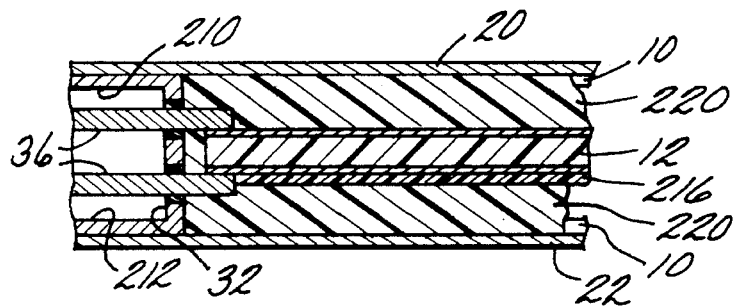
FIG. 22
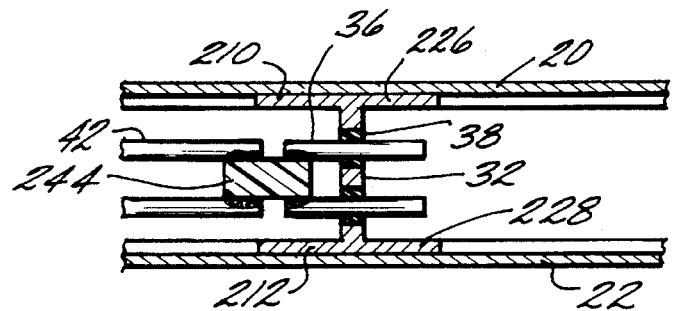
FIG. 26
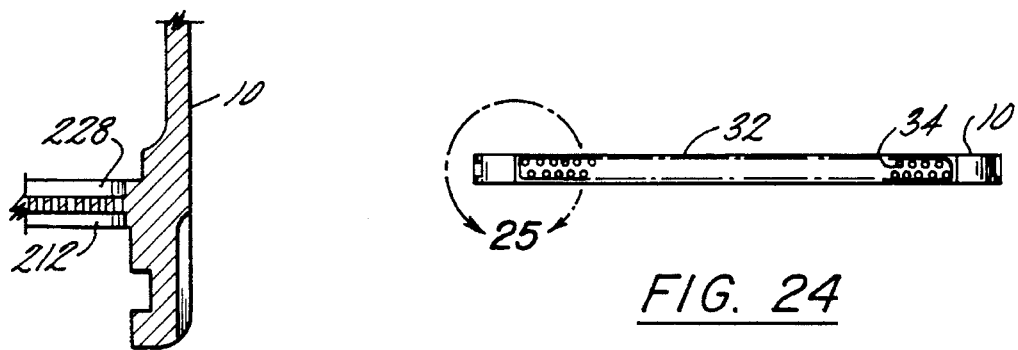
FIG. 23
FIG. 24
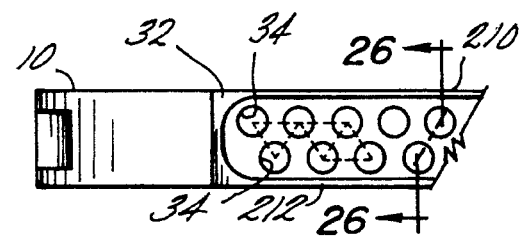
FIG. 25

HERMETICALLY SEALED MEMORY OR PC CARD UNIT HAVING A FRAME, HEADER AND COVERS IN BONDED ENGAGEMENT

CROSS-REFERENCE TO RELATED APPLICATION

This application is a continuation-in-part of application Ser. No. 08/150,497, filed Nov. 10, 1993 now abandoned, and a continuation-in-part of U.S. application Ser. No. 178,385 filed Dec. 23, 1993 U.S. Pat. No. 5,457,606.

BACKGROUND OF THE INVENTION:

This invention relates to the field of PC Cards such as mass storage systems, particularly a solid state mass storage system or memory package known as a PC card. More particularly, this invention relates to a hermetically sealed PC card that is especially suitable for industrial applications where conditions of high humidity and wide temperature ranges are encountered.

PCMCIA Cards, or PC Cards, are add-on devices about the size of a credit card, in length and width, but thicker. PC Cards slide into PCMCIA slots in computers. PC Cards come in several thicknesses, depending on application, which include memory upgrades, modems, network connectors, or even hard disk drives. At present, PC Cards are known as Type I, Type II and Type III. These three cards all have 68 pin connectors at the end and are of the same length and width; but they differ in height or thickness. Type I cards generally contain software programs or extra memory. Type II cards typically house modems (e.g., data and fax) and network adapters. Type III cards are thick enough to accommodate removable hard disk drives and wireless communication devices. It is conceivable that in the future even thicker cards, i.e., Type IV and higher designations, may be introduced.

The term flash card, "PC card", "memory card", "PC Card" and "PCMCIA Card" will be used interchangeably herein. PC card memory packages or mass storage systems currently exist which are compatible with PCMCIA standards. Such PC card units are available from Sundisk Corporation of Santa Clara, Calif. These existing PC card units from Sundisk have a plastic frame in which a memory card is retained. A plastic connector houses metallic pins which extend from the rear of the connector. The rearwardly facing pins are soldered directly to printed circuit lines on the memory card and the connector is loosely retained in notches in the frame. The frame and memory card are sandwiched between layers of insulating material and stainless steel outer covers on opposite sides of the frame and memory card. The stainless steel outer covers are bonded to the plastic frame by adhesive. The outer surface of the frame adjacent the connector has a keyway which complements a shoulder on the slot in the computer to ensure that the PC card is inserted in the right orientation. If an attempt is made to insert the card upside down, interference between the shoulder on the slot and the keyway structure on the card will prevent full insertion of the card into the slot.

While suitable for their intended purposes, some of the specifications for presently available PC cards make them inappropriate or unsuitable for industrial applications where high humidity environments and wide temperature ranges are encountered. In particular the present humidity specification for Sundisk PC cards is 8 %–95 %, non-condensing, for both operating and non-operating conditions, while the specification for temperature is 0° C. to 65° C. for operating conditions and –20° C. to +85° C. for non-operating conditions. Those specifications, particularly the humidity specification, limit the usefulness of the PC cards in certain industrial applications, and it is highly desirable to have a PC card with improved characteristics, especially in regard to humidity.

Also, a need has been identified to protect the connector pins of PC Cards from dirt and other contamination when not in use.

SUMMARY OF THE INVENTION

In accordance with this invention, a PC card is presented which satisfies the requirement of 0–100% condensing humidity for both non-operating and operating conditions. In addition, a desirable objective for the PC card of the present invention is that it satisfy a requirement for a nonoperating temperature range of from about –40° C. to +90° C. and an operating temperature range of from about –25° C. to +80° C. However, it will be understood that the improved humidity characteristic of the PC card of the present invention is by far the more important feature, even if temperature range improvement relative to existing PC cards is not achieved.

In accordance with the present invention, the circuit board or memory card is retained in a metal frame. The connector is also housed in the frame at a position spaced from the memory card. In one embodiment a header is welded in position in the frame between the memory card and the connector. The header is constructed of the same metal as the frame, and the header has a plurality of lead passages formed therein. In a preferred embodiment the header is an integral part of the frame as formed. In that preferred embodiment the frame and header are a single-piece construction, and welding is not required to join the header to the frame. In all embodiments, conducting pins pass through the lead passages in the header, and each pin is encapsulated in glass or ceramic in the header. Where the material of the header has a similar coefficient of thermal expansion (CTE), to that of glass, matched seals are used between the glass and the header and the pins. However, if the CTE of the header material is different from that of glass, then a compression seal is used between the glass and the header and the pins. The pins from the header are solder connected at one end to printed circuit lines on the memory card; and the other ends of the header pins are soldered to pins extending from the rear of the connector. The PC card assembly is completed by layers of insulating material on opposite sides of the memory card, and by outer metallic cover layers on opposite sides of the memory card welded to the frame. The frame, header and outer metal covers are all of the same metallic material, and the welding together of these elements, along with the glass or ceramic encapsulation of the header pins, results in a hermetically sealed PC card unit which can meet the requirement for 0–100% condensing humidity. In order to accommodate memory cards or other components that are smaller than the frame, a plastic tray can be retained within the frame by a friction fit, and the memory card or other components can be supported on the tray.

As an added benefit, it is also hoped that the PC card of the present invention will satisfy a temperature range requirement of from –40° C. to +95° C.; but the invention will be considered a success even if this temperature range cannot be achieved.

The foregoing and other features and advantages of the present invention will be apparent to and understood by those skilled in the art from the following detailed description and drawings.

BRIEF DESCRIPTION OF THE DRAWINGS:

Referring now to the drawings, wherein like elements are numbered alike in the several FIGURES:

FIG. 1 is a perspective view of the frame of the PC card of the present invention, with header and connector in place.

FIG. 2 is a detail showing the header-connector interface.

FIG. 3 is an exploded view of FIG. 1.

FIG. 22 is a partial sectional view of an assembled PC Card unit showing a detail of the present invention.

FIGS. 23, 24 and 25 are views similar to FIGS. 17-19 for another embodiment.

FIG. 26 is an enlarged cross section view along line 26—26 of FIG. 25 of the section 23—23 illustrating front and rear flanges on the header, with the addition of the printed wiring board of FIG. 27 and other features of the PC Card.

Figure 4:
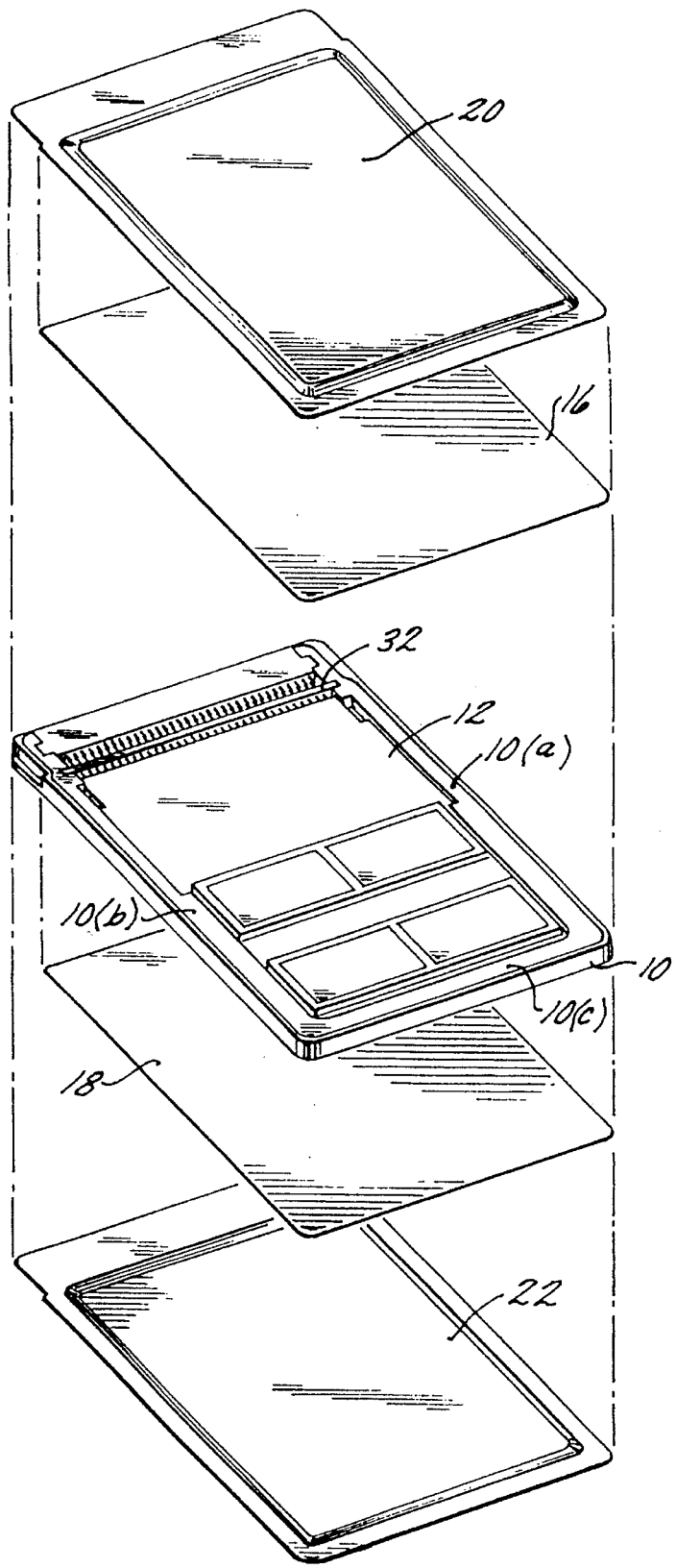
FIG. 4 is an exploded view showing the elements of the PC card of the present invention.

DESCRIPTION OF THE PREFERRED EMBODIMENT:

Referring first to FIG. 4, an exploded view of the PC card unit of the present invention is shown. The PC card unit has a rectangular metal frame 10 in which a circuit board/memory card 12 is retained. The details of circuit board/memory card 12 are not relevant to this invention, so the circuit board/memory card is shown only schematically. Those skilled in the art will know that circuit board/memory card 12 contains solid state memory chips, associated electronic circuitry, and printed circuit patterns interconnecting the memory chips and circuitry to each. The printed circuit patterns include connector pads 14 (see FIG. 2) for connecting the circuit board/memory card to the outside world.

Still referring to FIG. 4, the PC card unit also includes a pair of thin (about 0.001 inch) plastic polyimide (Kapton) insulating layers 16 and 18 on each side of frame 10 and memory card 12, and a pair of metallic covers 20 and 22. Layers 16 and 18 are sized to fit within the space defined by the inner boundary of frame 10 and the inner boundary of header 32. Layers 16 and 18 are shown as upper and lower sheets in FIG. 4, but they may also be a single sheet of material wrapped around memory card 10. In final assembly, metallic covers 20 and 22 are welded to metallic frame 10 to form part of the hermetic sealing of the PC card unit.

Referring now to FIGS. 1–3, frame 10 has upper and lower side ledges 24 and 26 on opposed side to house and retain memory card 12. The front end of frame 10 is open and has two pairs of notches 28a, 28b and 30a, 30b. A metallic header 32 (see also FIG. 2) has end portions sized and shaped to mate with notches 28a and 28b; and header 32 is positioned in the notches 28a, 28b and is welded to frame 10. As best seen in FIG. 2, header 32 has a plurality of through holes 34, through which pass conductive metallic pins 36. Each pin 36 extends on opposite sides of header 32 and is encapsulated in its hole 34 by glass encapsulating material 38. The glass 38 in each hole 34 fully occupies all of the space in each hole around each pin 36, and the glass is firmly bonded to the pin and to the surface of the hole to also provide hermetic sealing for the PC card unit. The encapsulating material for pins 36 could also be ceramic.

A plastic connector 40 has end portions sized and shaped to mate with notches 30a, 30b, and plastic connector 40 is engaged in and retained in the notches 30a, 30b in frame 10. Connector 40 has a plurality of pins 42 which are open at their forward ends to receive male plugs, and which extend rearwardly from connector 40. As best shown in FIG. 2, the rearwardly extending parts of the pins 42 are lapped to and soldered to the forwardly projecting parts of respective pins 36 of header 32, and the rearwardly projecting parts of header pins 36 are lapped to and soldered to connector pads 14 of the circuit patterns on memory card 12.

Frame 10 and header 32 are all made from the same metal, which may be any weldable metal such as, e.g., stainless steel, aluminum or Kovar (an alloy of steel, nickel and cobalt) which has a coefficient of thermal expansion (CTE) approximately equal to the CTE of glass, and other metals having CTE's approximately equal to the CTE of glass. Covers 20 and 22 may be made from the same metal as the frame and header, or the covers may be any metal that is compatible with the frame and header material as to welding characteristics.

In the assembly of the PC card of the present invention, memory card 12, (around which a thin layer of insulating material may have been previously wrapped and secured with polyimide tape) is mounted in frame 10, and the header 32 and connector 40 are then mounted into their respective notches 28a, 28b and 30a, 30b. The pins of header 32 are then soldered to connector pins 42 and to circuit pads 14. Header 32 is then welded in place in frame 10. Then, insulating layers 16, 18 (if not in the form of a single layer which is previously wrapped around memory card 12), and covers 20 and 22 are placed on opposite sides of frame 10 and welded to the frame at the two sides 10(*a*) and 10(*b*) and at the end 10(*c*). The forward ends of the covers 20 and 22 also extend over header 32 and cover most of connector 40; and the covers are also welded to header 32. As an alternative method of construction, header 32 can be welded into notches 28*a* and 28*b* before the header pins 36 are soldered to the contact pads 14 and connector pins 42. In either method of assembly, header 32 and connector 40 are mounted into their respective notches in the frame as a single unit, with the overlapping of the pins 42 and 36 (see FIG. 2) keeping the header 32 and connector 40 together prior to those pins being soldered. All welding is preferably by a continuous weld process such as electron beam or laser welding.

The fact that the covers 20 and 22 are welded all around to the frame 10 and the header 32, coupled with the fact that the pins 36 are encapsulated and sealed in glass 38 in the header, results in a completed PC card unit that is hermetically sealed and meets the requirement for 0–100% condensing humidity. The temperature range for the PC card units in the prior art was limited because the memory card 10 tends to absorb moisture at higher temperatures. However, since the PC card unit of the present invention is hermetically sealed, the card 10 is not exposed to moisture, and, thus, the sealed unit should also have improved temperature characteristics. Thus, it is anticipated that the PC card unit of this invention should satisfy temperature requirements for an operating temperature range of from about −25° C. to +80° C. and a nonoperating temperature range of from about −40° C. to +90° C.

If desired, e.g., for military application, the individual memory chips and circuit elements on card 10 can also be individually encapsulated. Also, the bonding of header 32 and covers 20 and 22 to frame 10 can be accomplished by soldering or any other method that will provide moisture-tight bonds.

It will also be noted that instead of a solid state memory card, a modem, a network connector, a magnetic memory disc drive, or any other computer related component could be housed and hermetically sealed within frame 10, with the rest of the unit, including frame 10, header 32 and covers 20, 22 being as previously described. This would produce a hermetically sealed PCMCIA Card having the desirable humidity and temperature characteristics described above for the PC card unit.

Figure 5:
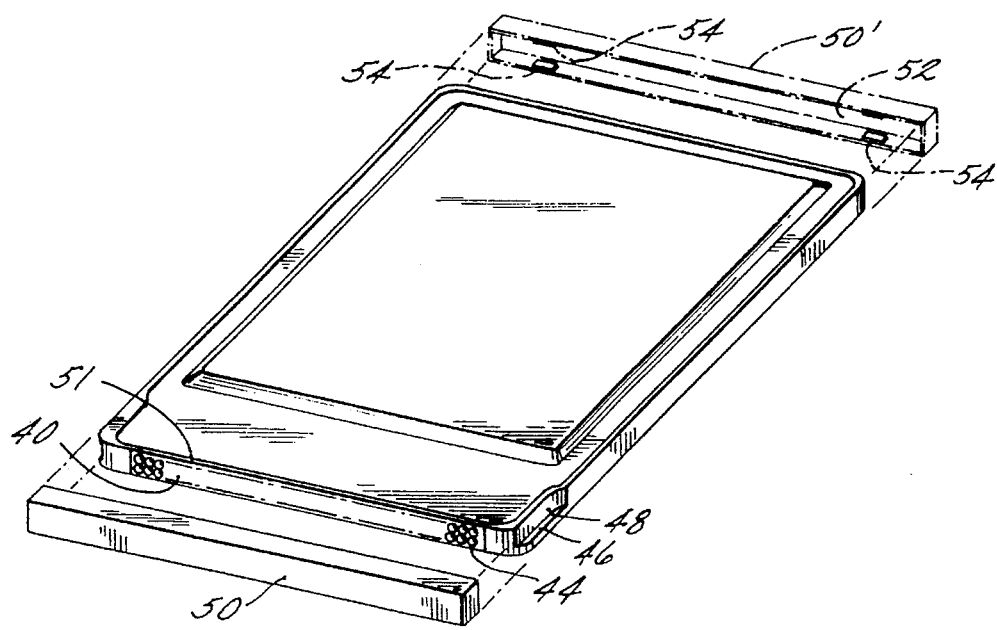
FIG. 5 is a perspective view showing an end cap embodiment for protecting the connector against contamination.

FIG. 5 shows the PC Card unit of the present invention from a front perspective view in which the front openings 44 to pins 42 are seen in connector 40. A keyway structure at the front of frame 10, prevents insertion of the PC Card into the computer slot in the wrong orientation. This keyway structure, which is a part of the prior art, consists of a shoulder 46 and a recess 48 on one side of the frame, while on the other side of the frame a recess 48*a* is sandwiched between upper and lower shoulders 46*a* and 46*b*. When the PC Card is presented to the computer slot in the correct orientation, the recess 48 mates with a complementary shoulder (not shown) on the slot in the computer (also not shown) into which the PC Card is inserted to permit full insertion of the PC Card into the slot for operation. However, if the PC Card is presented to the computer slot in the wrong direction, i.e., upside down, then the shoulders 46*a* and 46*b* on the other side of frame 10 will interfere with the shoulder on the slot, and the PC Card will be blocked from full insertion into the slot.

There is concern, particularly in industrial and other severe environments, that dirt, dust, moisture and/or other contaminants may enter openings 44 and clog or otherwise impair the interior of one or more of the female sections of pins 42. To combat such contamination to some degree, one simple measure that could be adopted is to place a cover 50 over the front of frame 10 to cover the openings 44 to the pins in connector 40 when the PC Card is removed from the computer. Cover 50 is shown in solid lines in FIG. 5 juxtaposed to the front end of the PC Card. Cover 50 is also shown in phantom (as 50') juxtaposed to the rear of the PC Card, where the cover may be stored for safekeeping when it is removed from the front end of the PC Card. Cover 50 may be a molded plastic part having a hollow interior 52 with snap fastener elements 54 to latch over a small lip on connector 40 at the front end of the PC Card to retain the cover on the PC Card (lip 51 being seen best in FIG. 7).

Figure 6:
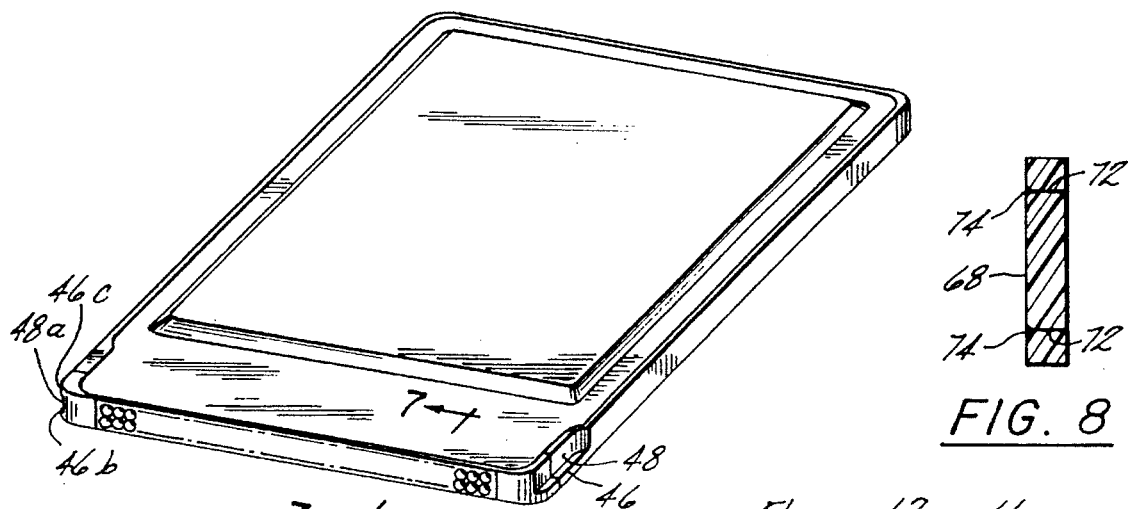
FIG. 6 is a perspective view of an elastomeric seal embodiment for protecting the connector against contamination.
Figure 8:
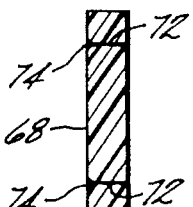
FIG. 8 is an enlarged view of the elastomeric seal of FIG. 7.
Figure 7:
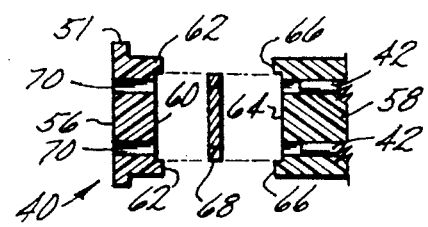
FIG. 7 is a sectional view along line 7—7 of FIG. 6.

Referring to FIGS. 6, 7 and 8, a more elaborate seal or barrier mechanism is shown for combatting contamination of pins 42. In this embodiment, connector 40 is composed of two parts, a front segment 56 and a rear segment 58. The rear face of front segment 56 has a recess 60 surrounded by a shoulder or border 62, and the front face of rear segment 58 has a recess 64 surrounded by a shoulder or border 66. In the final assembled unit, the front and rear segments 56, 58 are bonded together at shoulders or borders 62 and 66 to form a chamber in which an elastomeric seal or barrier element 68, e.g., silicone rubber, is housed. Elastomeric element 68 is bonded to the opposed facing surfaces of recesses 60 and 64. The pins 42 are housed in rear segment 58, and the front segment 56 has pin free passages 70 which are aligned with the pins 42. As best seen in FIG. 8, elastomer element 68 has a plurality of slits 72 which are aligned with the passages 70 and pins 42. Each slit 72 may have a small conical entry portion 74. It will be understood that one of each of the slits 72 is aligned with a pin 42 and its respective passage 70. Elastomeric element 68 serves to seal the PC Card against entry of contaminants. The slits 72 are very thin, so that the opposite sides of each slit are essentially in contact and the resilience and compliance of elastomeric element 68 essentially seals the slits when the PC Card is not mated to male pins on a plug within a computer. When the PC Card is inserted in the computer, the male pins from the plug pass through passages 70 and slits 72 to enter and make contact with pins 42. In that state, the slits are forced open to permit passage of the male pins, but the walls of the slits 72 surround and contact the male pins to provide sealing. Thus, elastomeric element provides a sealing function for the PC Card both when the PC Card is in and out of a computer.

Figure 9:
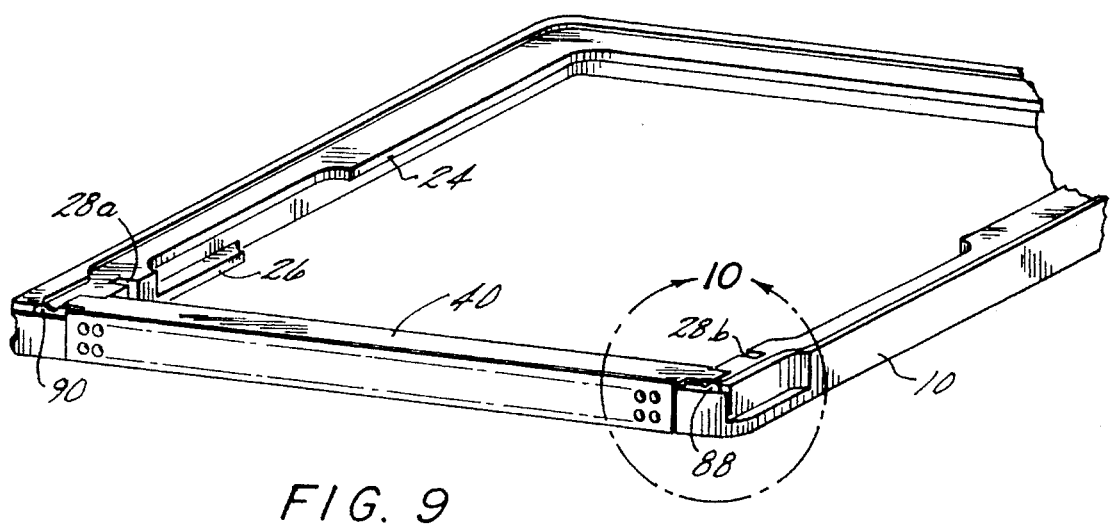
FIG. 9 is a perspective view of a shutter embodiment for protecting the connector against contamination.
Figure 10:
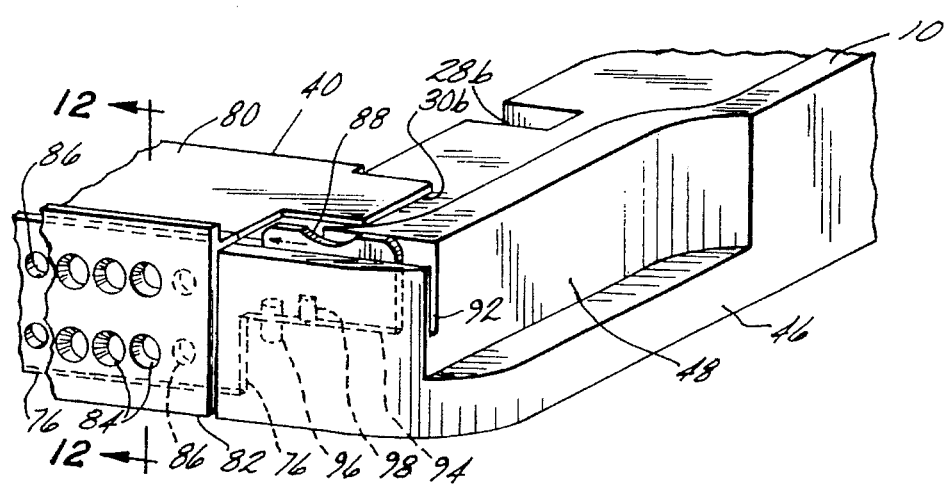
FIG. 10 is a detail of the shutter of FIG. 9.
Figure 11:
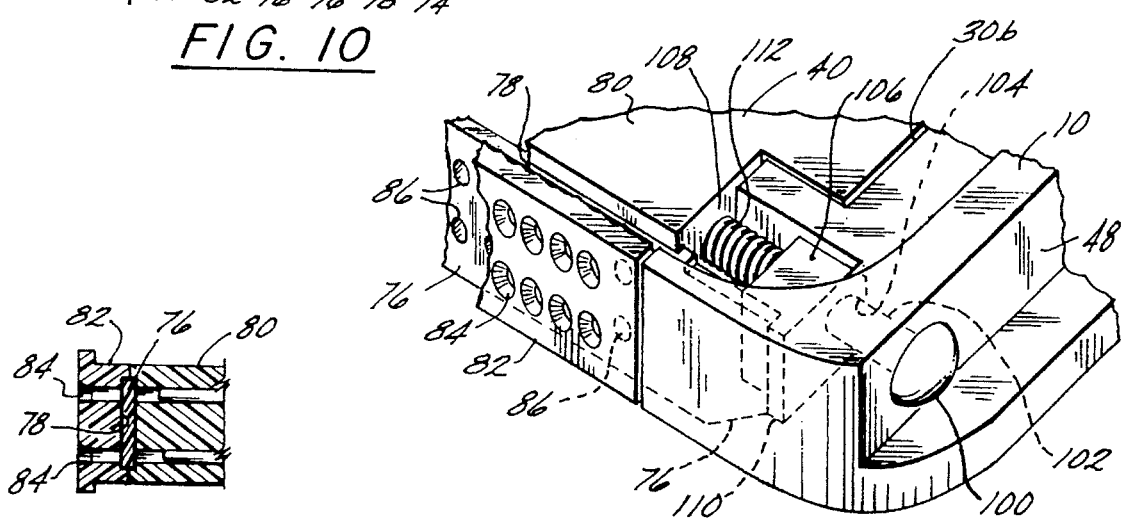
FIG. 11 is a perspective view of another embodiment of the shutter protector.
Figure 13:
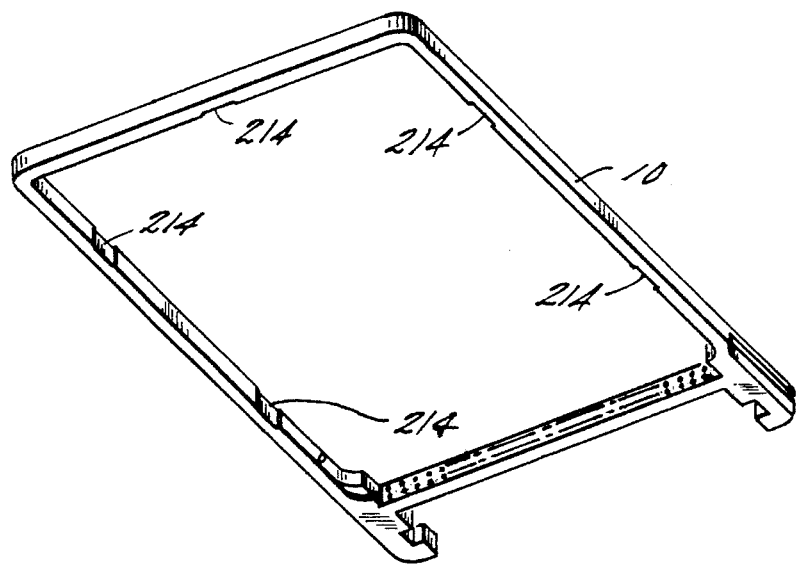
FIG. 13 is a perspective view of another embodiment of the frame and header of the PC card wherein the frame and header are of a one-piece construction.
Figures 14, 15, 16:
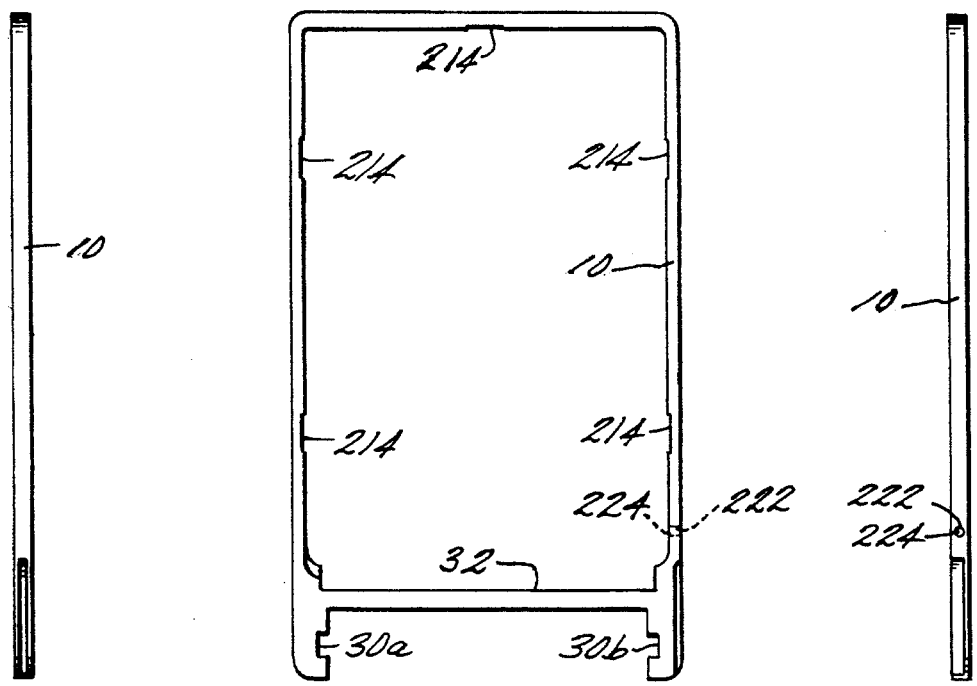
FIG. 14 is a plan view of the frame and header of the PC card.
FIGS. 15 and 16 are side views of the frame and header of the PC card.
Figure 17:
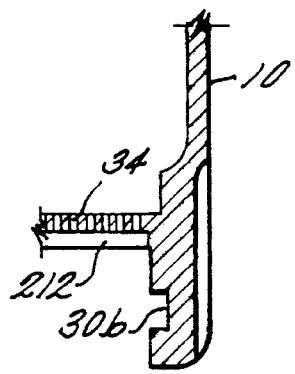
FIG. 17 is a cross-sectional enlarged view of a Kovar embodiment of that part of the invention indicated by section line 17—17 in FIG. 15 which illustrates a flange for a weld joint extending from the header.
Figure 18:
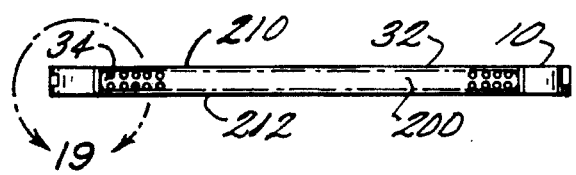
FIG. 18 is a front elevation view of the invention in either steel or Kovar.

Referring next to FIGS. 9–11, two more seal or barrier embodiments are shown. These embodiments incorporate a moveable shutter mechanism for combatting contamination. The shutter 76 is a thin sheet of plastic material (see FIGS. 10 and 11) which rides in a chamber or slot 78 (best seen in FIG. 11) near the front of connector 40. The pins 42 are housed in the rear part 80 of connector 40 to the rear of slot 78, and the front part 82 has pinless entry passages 84 aligned with each of the pins 42 in the rear part. Shutter 76 has a plurality of holes 86 equal in number to the passages 84 in the front connector part 82 and the pins 42 in the rear connector part 80. Shutter 76 and the holes 86 in shutter 76 are sized and positioned so that in a first position of shutter 76 the holes 86 align with the passages 84 and the pins 42, and in a second position of shutter 76 the holes 86 are out of alignment with the passages 84 and pins 42, and the material of shutter 76 between holes 76 blocks and seals communication between passages 84 and pins 42.

Figure 12:
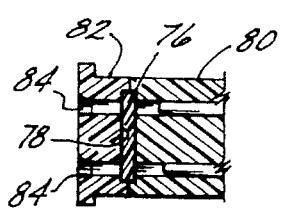
FIG. 12 is a sectional view along line 12—12 of FIG. 10.

The slot 78 which houses shutter 76 is best seen in FIG. 11, which is partly broken away to show the chamber or slot 78. It should, however, be understood that front connector part 82 and rear connector part 80 are separate pieces bonded together at facing top and bottom shoulders to form the chamber 78, see FIG. 12, with end passages to permit the lateral movement of shutter 76.

In the embodiment of FIGS. 9 and 10, shutter 76 is connected at each of its left and right ends to manually operable switches 88 and 90, respectively. Referring particularly to the detail of FIG. 9, switch 88 rides in a notch 92 at the front end of frame 10 and forward of notch 32b, and a reduced size portion 92 of shutter 76 is adhered to switch 88. An elastomeric element in the form of a cylinder 96 is housed in a recess in notch 92 behind switch 88, and switch 88 is provided with a corresponding notch 98. The structure of notch 92, reduced position 94, elastomeric cylinder 96 and notch 98 is repeated at the left end of the frame in conjunction with switch 90. In operation, manual movement of switch 88 to the left (as seen in FIGS. 9 and 10), moves shutter 76 and switch 90 leftward to an "open" position where shutter holes 86 are brought into alignment with entry passages 84 and pins 42 in connector segment 80, so that male plug pins in the computer can be inserted into the PC Card to contact pins 42. When switch 88 is moved leftward, notch 98 passes over elastomeric element 96, whereby elastomeric element 96 expands slightly and engages notch 98 to lightly hold switch 88 and shutter 76 in the open position to prevent unintentional movement of shutter 76. Similarly, when the PC Card has been removed from the computer and it is desired to seal the pins 42 against contamination, switch 90 (or 88) is moved to the right to a "closed" position, whereby the shutter material between adjacent holes 76 is brought into alignment with passages 84 to block and seal off the communication between passages 84 and pins 42. The structure of elastomeric cylinder 96 and thumb switch notch 98 are repeated for switch 90, so the shutter is also lightly held in the closed position to prevent unintentional movement to the open position.

Referring to FIG. 11, the shutter mechanism, per se, is the same as in the embodiment of FIGS. 9 and 10, but the actuation mechanism is different. In place of the manually actuated thumb switches of FIGS. 9 and 10, the embodiment of FIG. 11 has an automatic actuation mechanism. That automatic actuation mechanism includes a sliding button 100 at the end of a cylinder 102 which rides in a passageway 104 in frame 10. to be more precise, button 100 is located in recess 48 adjacent the front end of the frame. Cylinder 102 is connected to a rectangular block 106 which is located in a chamber 108 in frame 10 slightly forward of notch 30b. One end of block 106 has an extended portion which rides in a slot in the front of frame 10 to maintain the alignment and orientation of block 106, cylinder 102 and button 100. Shutter 76 is adhered to block 106 at the right end of the shutter. The rear side of block 106, i.e., the side opposite to button 100 is spring loaded to the fight by a spring 112 to move button 100 to the right (as shown in FIG. 11 ) and to move shutter 76 to the closed position whereby communication between passages 84 and pins 42 is blocked and sealed off when the PC Card is removed from the computer. However, when the PC Card is inserted in the computer slot, the orientation shoulder in the computer slot engages recess 48 and pushes pin 100 to the left against the force of spring 112 as the PC Card is moved into the computer. That leftward movement of pin 100 moves block 106 and shutter 76 leftward to the open position of the shutter, whereby the male pins of the computer internal plug can enter passageways 84 and contact pins 42 in the PC Card. On removal of the PC Card from the computer (actually on removal past the orientation shoulder on the slot), the force of spring 112 will move button 100 and shutter 76 rightward to the closed position to seal the pins 72 against contamination.

Referring now to FIGS. 13–28, several additional embodiments of the present invention are shown wherein the frame 10 and the header 32 are of one piece construction. As in the previous embodiments, through holes 34 (see, e.g., FIGS. 17–20) are located in header 32 for passage of conductive pins 36 encapsulated in glass 38 (see FIG. 20). Covers 20, 22 are formed of metal compatible with the metal of the the frame/header assembly for weldability. As used herein, the term compatibility means good welding characteristics between the covers and the frame/header unit. The pins 36 are also metal, the specific metal being selected to have a coefficient of thermal expansion (CTE) which either closely matches the CTE of the glass or differs therefrom by a desired amount, depending on whether a matched seal or a compression seal is to be effected at the glass/metal interfaces, as more fully described hereinafter.

Depending on the metal employed for the frame and header, the one piece frame/header assembly may be formed by different processes. At the present time, stainless steel and Kovar (an alloy of steel, nickel and cobalt) are the preferred metals for formation of the one piece frame/header assembly. Stainless steel is particularly suitable for forming the one piece frame/header assembly by the process of metal injection molding (MIM). At the present time, Kovar is not suitable for metal injection molding, so if Kovar is used the one piece frame/header assembly must be formed by machining, or casting and machining, and drilling of the through holes. The use of stainless steel has the advantages of low cost associated with the MIM process (about 20–25% of the cost of casing and machining), and it will not rust; but it has the drawback that it requires a compression seal between the glass and the conductive pins and the header. Kovar has the advantage that a matched seal can be used between the glass and the conductive pins and the header; but Kovar has the disadvantages that it may rust, and it is more expensive than stainless steel alloys, both because of the cost of the material and because it must be formed by casting and machining. The final choice of metal will depend on factors such as cost considerations and the requirements of particular applications.

In the conventional MIM process, metal powder, thermoplastics and other binder ingredients are mixed to form a pelletized molding compound at a typical volumetric ratio of 60% metal to 40% binder. This material is then injected into a preformed mold (which may be formed by CAD/CAM technology) to form a green state body. The green state body is typically 19–25% larger than the finished part. The green state body is removed from the mold and exposed to heat, solvent, or a combination of both to remove the binder material and form a debound brown state part. After debinding, the brown state part is about the same size as the green state part, but it is quite porous. The brown body is then sintered in a high temperature vacuum furnace. During the sintering process, the part shrinks about 17–22% to the final desired size. The sintered part has no through porosity and is typically 95–99% of theoretical density. Secondary machining or other processing may also be employed to achieve final size and/or finish or density.

As indicated above, stainless steel is suitable for formation into a unitary frame/header assembly by the MIM process, but Kovar is not at the present time. Formation of a unitary frame/header assembly with Kovar as the material of choice requires casting and/or machining.

Figure 19:
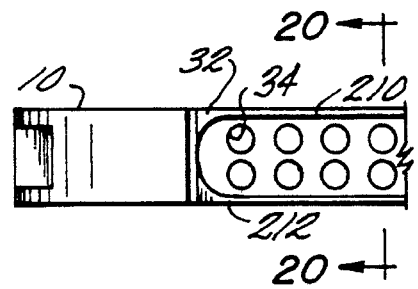
FIG. 19 is an enlarged view of the circumscribed section in FIG. 18.

When Kovar is chosen as the material for the integral frame 10/header 32 assembly, the pins 36 are preferably a steel with a CTE closely matched to the CTE of the glass. The pins may be coated with gold and/or nickel outside of the seal area to enhance solderability to the connector pins and to the memory card 12 or other electronic component. In this case, the seal between glass 38 and pins 36 and between glass 38 and the body of header 32 is a matched seal. As is known in the art, the CTE of Kovar and the CTE of glass are approximately the same, and, as also known in the art, the basic principle of a matched seal is the equal coefficients of expansion of the glass and the metal parts plus formation of an oxide bond between the glass 38 and the metal parts, i.e., pins 36 and header 32. Kovar is desirable for use in the present invention because matched seals may be circular, rectangular or oval in shape, and they require less wall and web thickness than compression seals. Thus, as best shown in FIG. 19, the array of pin holes 34 may be in-line horizontally and vertically for direct alignment with and solder connection to the pins 42 from a connector 40 (see FIG. 3), which would be mounted in notches 30(*a*), 30(*b*) at the end of the frame.

As with the embodiment of FIGS. 1–4, covers 20, 22 are welded to the upper and lower surfaces of frame 10 and to header 32. Since Kovar is not readily available in thin sheet stock for use as the covers 20, 22, the covers are made of a material compatible for welding to the frame/header assembly. Thus, with a Kovar unitary frame/header unit, the covers 20, 22 may be a compatible stainless steel, such as 304 stainless steel W finish.

An improvement over the embodiment of FIG. 1–4 is found in the incorporation of upper and lower flanges 210 and 212 on header 32. These flanges preferably extend away from the space defined by frame 10 for housing the PC board, and toward the front of the unit toward the notches 30*a*, 30*b*. The flanges provide welding surfaces remote from the glass seals 38 to which the front part of the covers 20, 22 can be welded to the header. The welds are effected near the ends of the flanges remote from the glass seals, and this protects the glass seals from damage due to thermal stress during welding. It also ensures the availability of adequate area and volume to make a suitable weld to achieve hermetic sealing. Mil spec requirements call for a spacing of at least 0.040" between a glass seal and a welding site. Compliance with this Mil spec is achieved with the presence of welding flanges 210, 212.

Another improvement over the embodiment of FIGS. 1–4 is the presence of a plurality of detents 214 at the inner boundary surface of frame 10. These detents provide for snap action and friction retention of a shallow tray 216 with mating projections 218 (see FIG. 21) within the space defined by unitary frame 10 and header 32. Memory cards of varying sizes, or other components, may be placed in and supported by tray 216, thus making the unitary frame/header assembly a universal unit capable of accommodating memory cards and components of various sizes.

Still another improvement over the embodiment of FIGS. 1–4 is the inclusion of a low durometer, liquid epoxy gel material 220, such as Stycast 1365-0 parts A & B, in the interior volume of the hermetically sealed PC Card unit. Referring to FIG. 22, the gel 220 occupies at least 80% of the interior volume of the sealed PC card unit is filled with gel 220. The liquid gel constitutes an incompressible and nonexpandable liquid in the interior volume of the PC Card unit, which prevents compression and/or expansion of covers 20, 22 when exposed to changes in external pressure. This permits a PC Card unit to be used in both high pressure environments and low pressure environments and to move from one such environment to the other without compressing or expanding the covers. Compression and expansion of the covers is to be avoided to avoid jeopardizing the integrity of the hermetic seal at the weld sites. The gel 220 is introduced into the interior volume of the PC Card unit via a fill hole 222 (see FIGS. 14 and 16), which is closed by a threaded plug 224.

When stainless steel is used in the material for unitary frame 10/head 32 assembly, the seal between glass 38 and pins 36 and header 32 is not a matched seal, because the CTE of stainless steel and the CTE of glass are different, the CTE of stainless steel being higher than the CTE of the glass. In this situation, the seal is a compression or mismatched seal wherein the glass is loaded in compression. When the frame/header assembly is stainless steel, the covers are 304 stainless steel W finish or other steel compatible for welding to the frame/header assembly, and the pins are stainless steel, but with a CTE higher than the CTE of the glass to maintain the glass seal in compression. Pins 36 are formed of a steel chosen to have a CTE approximately the same as that of the frame/header material, i.e., a higher CTE than the CTE of the glass, to also maintain the glass seal in compression. The pins forward and rearward of the seal may be coated with gold and/or nickel for enhanced solderability to the pins 42 and the memory card 12 or other electronic component.

As is known in the art, the underlying principle of a mismatched or compression seal is more physical than chemical, in that while matched seals depend on an oxide bond and very close CTEs between the glass and metal, a mismatched seal depends to a great extent on the elasticity of glass and intentionally mismatched CTEs of the glass and metal. However, more than a physical bond is present in a mismatched seal. A mismatched seal has great physical strength due to the fact that glass is stronger in compression than in tension.

A mismatched seal requires greater web or wall thickness in the header (i.e., greater than in a matched seal) to maintain the compressive load on the glass. Referring to FIGS. 23–26, to achieve this greater web thickness for a unitary stainless steel frame/header assembly, the holes 34 are arranged in a staggered array. The requirement for the number of holes is the same whether the holes are in an aligned army (as in FIGS. 18 and 19), or in the staggered array of FIGS. 24 and 25. The number is set by the number of pins on the connector, usually 68 in PCMCIA applications. Thus, the web material between adjacent holes is maximized by staggering the holes so that the centers of each three adjacent holes are the points of equilateral triangles (see the dashed lines in FIG. 25).

Figure 20:
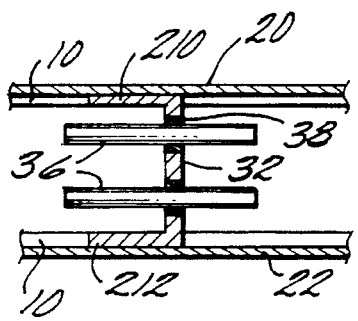
FIG. 20 is a sectional view taken along line 20—20 of FIG. 19.
Figure 21:
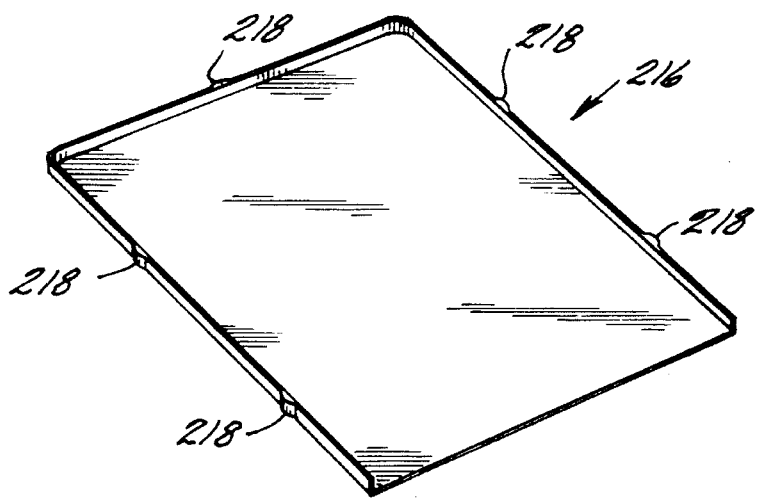
FIG. 21 is a perspective view of a tray for use with the present invention.

Since the glass and the stainless steel expand at different rates, the header of FIG. 20, with the forwardly projecting flanges 210 and 212, will tend to bow when exposed to the heat of formation of the glass seals or the heat of welding. Referring to FIG. 26, to eliminate that bowing, the stainless steel header is formed in the shape of an I beam, with flanges 210 and 212 extending rearwardly. In this configuration of the header, the covers 20, 22 are welded to flanges 210 and 212 at a sufficient distance from the glass seals 38 to avoid thermal stressing of the glass seals, and the header does not bow from exposure to heat during processing to form the glass seals or when welding of the covers to the header flanges.

As noted above and as shown in FIGS. 24 and 25, the array of holes 34 is staggered when stainless steel and compression seals are employed in header 32. That staggered array creates an alignment mismatch between the pins 42 projecting rearwardly from connector 40 and the pins 36 extending forward from header 32. To compensate for this mismatch, an interconnect printed wiring board 244 (see FIGS. 26 and 27) is positioned between the pins 42 of the connector and the pins 36 of the header. Referring to FIG. 28, board 244 has an insulating substrate 246 with conductive pads 248 therebetween. Pins 42 are spaced X inch apart on center; and the pins 36 are also spaced X inch apart; and the pins 42 and 36 are offset from each other by X/2 inch. Conductive pads 248 are approximately 0.6X inch wide, so each pad 248 is contacted by one pin 42 and one pin 36 to establish electrical contact between those two pins. The pins are soldered to the respective conductive pads. An array of pads 248 is located on both sides of substrate 246 so that board 244 establishes electrical contact between all of the appropriate pairs of pins 42 and 36.

While the unitary PC Card of FIGS. 13–25 is sized to match the size of conventional PCMCIA cards, and hence fit into a PCMCIA slot in a computer without any overhang, the incorporation of printed wiring board 244 into the PC Card may require elongation of the frame 10, whereby the PC Card may have a slight overhang when inserted into the PCMCIA slot.

Figure 27:
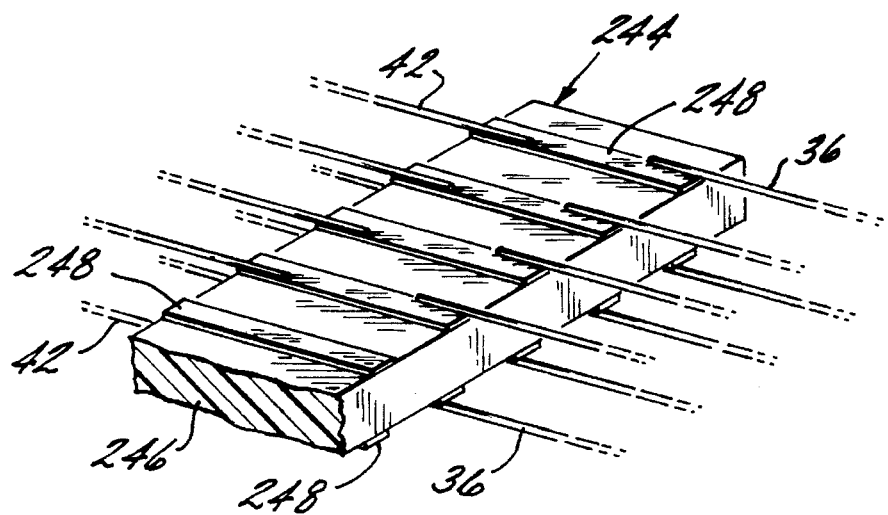
FIG. 27 is a perspective view of a printed wiring board for use with the embodiment of FIG. 26.
Figure 28:
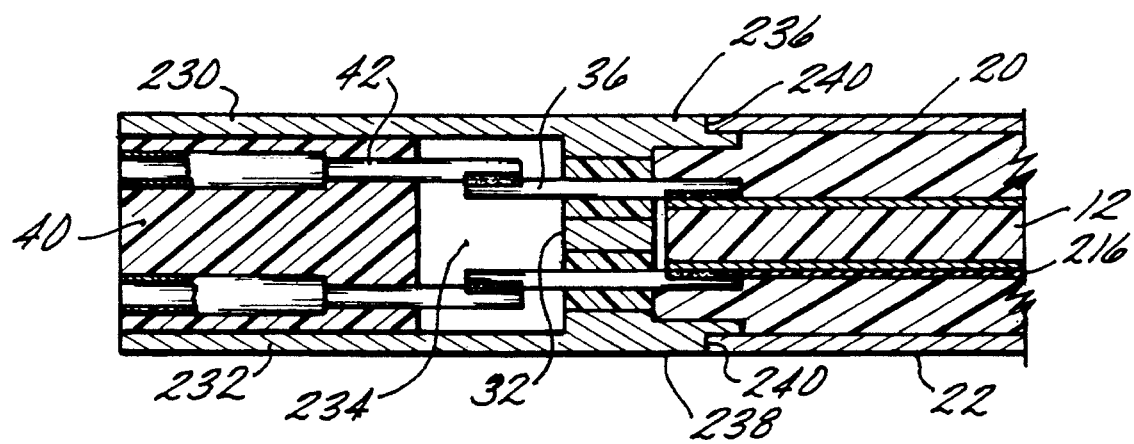
FIG. 28 is a partial sectional view of still another embodiment of the invention.

Another variant on the construction of the unitary frame/header construction is shown in FIG. 27. In this variant, the header 32 has a forward overhang, top and bottom, 230 and 232, respectively, forming a recess or pocket 234 in which connector 40 is housed and supported. This overhang and pocket configuration eliminates the need for the forwardmost set of notches 30a, 30b (see FIG. 3) which would otherwise retain connector 40. In the variant of FIG. 27, top and bottom flanges 236 and 238 extend rearwardly from the header. These flanges are stepped to form shoulders 240 and 242, and the top and bottom covers 20, 22 are butted against shoulders 240 and 242, respectively, and are welded to the reduced thickness portion of each rear flange. This construction also locates the cover/header weld sites sufficiently far from the glass seals 38 to avoid thermal stress of the glass during welding of the covers to the header. As in all other embodiments, pins 42 and 36 are soldered to each other for electrical connection and the rearwardly facing pins are soldered to memory board or electronic component 12.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. A hermetically sealed memory unit, including:

a frame;

a memory unit retained in said frame, said memory unit including circuit elements;

a header bonded to said frame, said header including a plurality of conductive pins passing through and being encapsulated in the header, said pins extending forward and rearward from said header, said rearwardly extending pins being bonded to said circuit elements;

a connector retained in said frame adjacent to and forward of said header, said connector having rearwardly facing pins which are bonded to the forwardly extending pins of said header; and first and second covers bonded to said frame and said header in sealing engagement therewith, said frame, said header, and said first and second covers cooperating to form a hermetically sealed space in which said memory unit is located.

2. The hermetically sealed memory unit of claim 1 wherein:

said frame, said header and said covers are all of the same metallic material.

3. A hermetically sealed memory unit as in claim 1 wherein:

said memory unit is a solid state memory unit.

4. A hermetically sealed memory unit, including:

a frame, said frame having opposed side portions joined by a rear portion;

first and second pairs of notches in said side portions near the ends thereof removed from said rear portion;

a memory unit retained in said frame, said memory unit including circuit elements;

a header retained in the first pair of said notches and extending between said side portions of said frame; said header being bonded to said frame, said header including a plurality of conductive pins passing through and being encapsulated in the header, said pins extending forward and rearward from said header, said rearwardly extending pins being bonded to said circuit elements;

a connector retained in the second pair of notches and extending between said side portions of said frame at a position adjacent to said header on the side of said header removed from the rear portion of the frame, said connector having rearwardly facing pins which are bonded to the forwardly extending pins of said header; and first and second covers bonded to said frame and said header in sealing engagement therewith, said frame, said header, and said first and second covers cooperating to form a hermetically sealed space in which said memory unit is located.

5. The hermetically sealed memory unit of claim 4 wherein:

said frame, said header and said covers are all of the same metallic material.

6. A hermetically sealed memory unit as in claim 5 wherein:

said memory unit is a solid state memory unit.

7. A hermetically sealed memory unit as in claim 1 including:

first and second flanges extending from said header;

said first cover being bonded to said first flange, and said second cover being bonded to said second flange.

8. A hermetically sealed memory unit as in claim 1 wherein:

said header has the general shape of an I beam in cross section, including a center body through which said conductive pins pass, a first pair of flanges extending in opposite directions from the top of said center body, and a second pair of flanges extending in opposite directions from the bottom of said center body;

said first cover being bonded to one of said first pair of flanges, and said second cover being bonded to one of said second pair of flanges.

9. A hermetically sealed memory unit as in claim 1, including:

a substantially incompressible and nonexpandable material within the hermetically sealed interior of said memory unit, said material filling substantially all of the space around said memory unit within the volume defined by said frame, said header and said first and second covers.

10. A hermetically sealed memory unit as in claim 1 including:

tray means for supporting said memory unit; and means for securing said tray means to said frame.

11. A hermetically sealed memory unit as in claim 1 including:

first and second flanges extending forwardly from said header toward said connector and defining a space for housing said connector.

12. A hermetically sealed memory unit as in claim 1 including:

first and second spaced apart flanges extending rearwardly from said header, each of said flanges having a stepped portion defining a shoulder and a portion of reduced thickness;

said first cover abutting the shoulder of said first flange and being bonded to the reduced thickness portion of said first flange; and said second cover abutting the shoulder of said second flange and being bonded to the reduced thickness portion of said second flange.

13. A hermetically sealed memory unit as in claim 1 including:

a plurality of holes in said header for passage of said conductive pins, each of said conductive pins being retained and sealed in a respective one of said holes by a glass seal.

14. A hermetically sealed memory unit as in claim 13 wherein:

the CTE of the glass seal and the CTE of the header material are approximately equal; and the glass seal at each of said conductive pins is a matched seal.

15. A hermetically sealed memory unit as in claim 14 wherein:

first and second flanges extending from said header;

said first cover being bonded to said first flange, and said second cover being bonded to said second flange.

16. A hermetically sealed memory unit as in claim 13 wherein:

the CTE of the glass seal and the CTE of the header material are dissimilar; and the glass seal at each of said conductive pins is a compressive seal.

17. A hermetically sealed memory unit as in claim 16 wherein:

said header has the general shape of an I beam in cross section, including a center body through which said conductive pins pass, a first pair of flanges extending in opposite directions from the top of said center body, and a second pair of flanges extending in opposite directions from the bottom of said center body;

said first cover being bonded to one of said first pair of flanges, and said second cover being bonded to one of said second pair of flanges.

18. A hermetically sealed memory unit as in claim 13 wherein:

said holes in said header are arranged in a pair of rows, with the holes in each row being aligned.

19. A hermetically sealed memory unit as in claim 13 wherein:

said holes in said header are arranged in a pair of rows, with the holes in each row being offset to maximize the spacing between adjacent holes.

20. A hermetically sealed memory unit as in claim 19 including:

a printed wiring board between the rearwardly facing pins of said connector and the forwardly extending pins from said header;

said printed wiring board having conductive pads, each of said pads being contacted by and electrically interconnecting one of said connector pins and one of said header pins.

21. A hermetically sealed PC Card, including:

a frame;

an electronic unit retained in said frame, said unit including circuit elements;

a header bonded to said frame, said header including a plurality of conductive pins passing through and being encapsulated in the header, said pins extending forward and rearward from said header, said rearwardly extending pins being bonded to said circuit elements;

a connector retained in said frame adjacent to and forward of said header, said connector having rearwardly facing pins which are bonded to the forwardly extending pins of said header; and first and second covers bonded to said frame and said header in sealing engagement therewith, said frame, said header, and said first and second covers cooperating to form a hermetically sealed space in which said electronic unit is located.

22. The hermetically sealed PC Card of claim 21 wherein:

said frame, said header and said covers are all of the same metallic material.

23. A hermetically sealed PC Card as in claim 21 wherein:

said electronic unit is a solid state memory unit.

24. A hermetically sealed PC Card as in claim 21 wherein:

said electronic unit is a computer related component.

25. A hermetically sealed PC Card as in claim 21 wherein:

said electronic unit is at least one of a solid state memory unit, a computer program, a modem, a network adapter, a disc drive and a wireless communication device.

26. A hermetically sealed PC Card as in claim 21 including:

first and second flanges extending from said header;

said first cover being bonded to said first flange, and said second cover being bonded to said second flange.

27. A hermetically sealed PC Card as in claim 21 wherein:

said header has the general shape of an I beam in cross section, including a center body through which said conductive pins pass, a first pair of flanges extending in opposite directions from the top of said center body, and a second pair of flanges extending in opposite directions from the bottom of said center body;

said first cover being bonded to one of said first pair of flanges, and said second cover being bonded to one of said second pair of flanges.

28. A hermetically sealed PC Card as in claim 21, including:

a substantially incompressible and nonexpandable material within the hermetically sealed interior of said memory unit, said material filling substantially all of the space around said memory unit within the volume defined by said frame, said header and said first and second covers.

29. A hermetically sealed PC Card as in claim 21 including:

tray means for supporting said memory unit; and means for securing said tray means to said frame.

30. A hermetically sealed PC Card as in claim 21 including:

first and second flanges extending forwardly from said header toward said connector and defining a space for housing said connector.

31. A hermetically sealed PC Card as in claim 21 including:

first and second spaced apart flanges extending rearwardly from said header, each of said flanges having a stepped portion defining a shoulder and a portion of reduced thickness;

said first cover abutting the shoulder of said first flange and being bonded to the reduced thickness portion of said first flange; and said second cover abutting the shoulder of said second flange and being bonded to the reduced thickness portion of said second flange.

32. A hermetically sealed PC Card as in claim 21 including:

a plurality of holes in said header for passage of said conductive pins, each of said conductive pins being retained and sealed in a respective one of said holes by a glass seal.

33. A hermetically sealed PC Card as in claim 32 wherein:

the CTE of the glass seal and the CTE of the header material are approximately equal; and the glass seal at each of said conductive pins is a matched seal.

34. A hermetically sealed PC Card as in claim 33 wherein:

first and second flanges extending from said header;

said first cover being bonded to said first flange, and said second cover being bonded to said second flange.

35. A hermetically sealed PC Card as in claim 32 wherein:

the CTE of the glass seal and the CTE of the header material are dissimilar; and the glass seal at each of said conductive pins is a compressive seal.

36. A hermetically sealed PC Card as in claim 35 wherein:

said header has the general shape of an I beam in cross section, including a center body through which said conductive pins pass, a first pair of flanges extending in opposite directions from the top of said center body, and a second pair of flanges extending in opposite directions from the bottom of said center body;

said first cover being bonded to one of said first pair of flanges, and said second cover being bonded to one of said second pair of flanges.

37. A hermetically sealed PC Card as in claim 32 wherein:

said holes in said header are arranged in a pair of rows, with the holes in each row being aligned.

38. A hermetically sealed PC Card as in claim 32 wherein:

said holes in said header are arranged in a pair of rows, with the holes in each row being offset to maximize the spacing between adjacent holes.

39. A hermetically sealed PC Card as in claim 38 including:

a printed wiring board between the rearwardly facing pins of said connector and the forwardly extending pins from said header;

said printed wiring board having conductive pads, each of said pads being contacted by and electrically interconnecting one of said connector pins and one of said header pins.

40. A hermetically sealed PC Card, including:

a frame, said frame having opposed side portions joined by a rear portion;

first and second pairs of notches in said side portions near the ends thereof removed from said rear portion;

an electronic unit retained in said frame, said unit including circuit elements;

a header retained in the first pair of said notches and extending between said side portions of said frame; said header being bonded to said frame, said header including a plurality of conductive pins passing through and being encapsulated in the header, said pins extending forward and rearward from said header, said rearwardly extending pins being bonded to said circuit elements;

a connector retained in the second pair of notches and extending between said side portions of said frame at a position adjacent to said header on the side of said header removed from the rear portion of the frame, said connector having rearwardly facing pins which are bonded to the forwardly extending pins of said header; and first and second covers bonded to said frame and said header in sealing engagement therewith, said frame, said header, and said first and second covers cooperating to form a hermetically sealed space in which said electronic unit is located.

41. A hermetically sealed PC Card as in claim 40 wherein:

said frame, said header and said covers are all of the same metallic material.

42. A hermetically sealed PC Card as in claim 40 wherein:

said electronic unit is a solid state memory unit.

43. A hermetically sealed PC Card as in claim 40 wherein:

said electronic unit is a computer related component.

44. A hermetically sealed PC Card as in claim 40 wherein:

said electronic unit is at least one of a solid state memory unit, a computer program, a modem, a network adapter, a disc drive and a wireless communication device.

45. A hermetically sealed PC Card as in claim 40 including:

first and second flanges extending from said header;

said first cover being bonded to said first flange, and said second cover being bonded to said second flange.

46. A hermetically sealed PC Card as in claim 40 wherein:

said header has the general shape of an I beam in cross section, including a center body through which said conductive pins pass, a first pair of flanges extending in opposite directions from the top of said center body, and a second pair of flanges extending in opposite directions front the bottom of said center body;

said first cover being bonded to one of said first pair of flanges, and said second cover being bonded to one of said second pair of flanges.

47. A hermetically sealed PC Card as in claim 40, including:

a substantially incompressible and nonexpandable material within the hermetically sealed interior of said memory unit, said material filling substantially all of the space around said memory unit within the volume defined by said frame, said header and said first and second covers.

48. A hermetically sealed PC Card as in claim 40 including:

tray means for supporting said memory unit; and means for securing said tray means to said frame.

49. A hermetically sealed PC Card as in claim 40 including:

first and second flanges extending forwardly from said header toward said connector and defining a space for housing said connector.

50. A hermetically sealed PC Card as in claim 40 including:

first and second spaced apart flanges extending rearwardly from said header, each of said flanges having a stepped portion defining a shoulder and a portion of reduced thickness;

said first cover abutting the shoulder of said first flange and being bonded to the reduced thickness portion of said first flange; and said second cover abutting the shoulder of said second flange and being bonded to the reduced thickness portion of said second flange.

51. A hermetically sealed PC Card as in claim 40 including:

a plurality of holes in said header for passage of said conductive pins, each of said conductive pins being retained and sealed in a respective one of said holes by a glass seal.

52. A hermetically sealed PC Card as in claim 51 wherein:

the CTE of the glass seal and the CTE of the header material are approximately equal; and the glass seal at each of said conductive pins is a matched seal.

53. A hermetically sealed PC Card as in claim 52 wherein:

first and second flanges extending from said header;

said first cover being bonded to said first flange, and said second cover being bonded to said second flange.

54. A hermetically sealed PC Card as in claim 51 wherein:

the CTE of the glass seal and the CTE of the header material are dissimilar; and the glass seal at each of said conductive pins is a compressive seal.

55. A hermetically sealed PC Card as in claim 51 wherein:

said header has the general shape of an I beam in cross section, including a center body through which said conductive pins pass, a first pair of flanges extending in opposite directions from the top of said center body, and a second pair of flanges extending in opposite directions from the bottom of said center body;

said first cover being bonded to one of said first pair of flanges, and said second cover being bonded to one of said second pair of flanges.

56. A hermetically sealed PC Card as in claim 51 wherein:

said holes in said header are arranged in a pair of rows, with the holes in each row being aligned.

57. A hermetically sealed PC Card as in claim 51 wherein:

said holes in said header are arranged in a pair of rows, with the holes in each row being offset to maximize the spacing between adjacent holes.

58. A hermetically sealed PC Card as in claim 57 including:

a printed wiring board between the rearwardly facing pins of said connector and the forwardly extending pins from said header;

said printed wiring board having conductive pads, each of said pads being contacted by and electrically interconnecting one of said connector pins and one of said header pins.

59. A hermetically sealed PC Card comprising:

a unitary housing including a frame and a header;

an electronic unit retained within said frame, said electronic unit including circuit elements;

said header of said unitary housing including a plurality of conductive pins passing through and being sealed in said header, said pins extending forward and rearward from said header, said rearwardly extending pins being bonded to at least one circuit element retained within said frame;

a connector retained in said unitary frame and header, said connector being mounted in said frame forward of said header, said connector having rearward facing pins for bonding to said forward extending pins of said header; and first and second covers bonded to said frame and header in sealing engagement therewith, said frame, header and covers cooperating to form a hermetically sealed space in which said electronic unit is located.

60. A hermetically sealed PC Card as in claim 59 wherein:

said unitary housing and said covers are of compatible metals for purposes of welding.

61. A hermetically sealed PC Card as in claim 59 wherein:

the unitary frame and header are constructed of a metal alloy.

62. A hermetically sealed PC Card as in claim 59 wherein:

the alloy is selected from the group consisting of Kovar, Rodar and Thurlo.

63. A hermetically sealed PC Card as in claim 59 wherein:

said conductive pins are encapsulated in glass in a matched seal configuration.

64. A hermetically sealed PC Card as in claim 63 wherein:

the header includes forwardly extending flanges at the top and bottom of said header.

65. A hermetically sealed PC Card as in claim 64 wherein:

said conductive pins are sealed in glass in said header, and each of said flanges is sufficiently wide to provide a welding surface while maintaining at least 0.040 inches clearance from any glass seal within said header.

66. A hermetically sealed PC Card as in claim 60 wherein:

said unitary frame and header is constructed of stainless steel.

67. A hermetically sealed PC Card as in claim 66 wherein:

the stainless steel header includes forwardly and rearwardly extending flanges at both the top and bottom of the header.

68. A hermetically sealed PC Card comprising:

a unitary metal housing including a frame and a header;

an electronic unit within said frame and header;

retaining means for retaining said electronic unit within said frame and header;

a plurality of through holes in said header, said through holes being in a predetermined array;

a conductive pin passing through each of said through holes, each pin having a portion extending forward of said header and a second portion extending rearward of said header;

seal means surrounding each said conductive pin in each through hole;

a connector retained in said unitary frame and header forward of said header, said connector having rearward facing conductive pins extending toward said header;

the first portion of said conductive pins of said header being electrically connected to said pins of said connector, and the second portions of said conductive pins of said header being electrically connected to said electronic unit within said frame and header;

first and second covers welded to said unitary frame and header, said covers being of a metal compatible with the metal of said frame and header for purposes of welding; and said frame, and header, said cover, and said seal means around each of said conductive pins cooperating to form a hermetically sealed space in which said electronic unit is located.

69. A hermetically sealed PC Card as in claim 68 wherein:

said seal means is a glass seal.

70. A hermetically sealed PC Card as in claim 69 wherein:

the CTE of the glass seals and the CTE of the metal of said unitary frame and header and the CTE of the conductive pins of the header are approximately equal, and the seal means is a matched seal.

71. A hermetically sealed PC Card as in claim 70 wherein:

said header includes flanges extending from the top and bottom of said header, said first and second covers being welded to said header at said first and second flanges and a distance sufficiently removed from the glass seals in said header to avoid harmful thermal stressing of said glass seals during welding.

72. A hermetically sealed PC Card as in claim 71 wherein said distance is at least 0.040" from the glass seals to the center of the weld.

73. A hermetically sealed PC Card as in claim 71 wherein:

the metal of said unitary frame and header is selected from the group consisting of Kovar, Rodar and Thurlo.

74. A hermetically sealed PC Card as in claim 69 wherein:

the CTE of the glass seals is dissimilar from the CTE of the metal of said unitary frame and header and from the CTE of the conductive pins of the header; and the seal means is a compression seal.

75. A hermetically sealed PC Card as in claim 74 wherein:

said header includes top flanges extending in opposite directions from the top of the header and bottom flanges extending in opposite directions from the bottom of said header, said first cover being welded to one of said top flanges, and said second cover being welded to one of said bottom covers, and the welds of the covers to the header being at a distance from the glass seals in the header to avoid harmful thermal stressing of the glass seals during welding.

76. A hermetically sealed PC Card as in claim 75 wherein said distance is at least 0.040" from the glass seals to the center of the weld.

77. A hermetically sealed PC Card as in claim 74 wherein:

the metal of said unitary frame and header is stainless steel.

78. A hermetically sealed PC Card as in claim 68, including:

a substantially incompressible and nonexpandable material within the hermetically sealed interior of said memory unit, said material filling substantially all of the space around said memory unit within the volume defined by said frame, said header and said first and second covers.

79. A hermetically sealed PC Card as in claim 68 wherein:

said electronic unit is at least one of a solid state memory unit, a computer program, a modem, a network adapter, a disc drive and a wireless communication device.

80. A hermetically sealed PC Card as in claim 68 including:

tray means for supporting said memory unit; and means for securing said tray means to said frame.

81. A hermetically sealed PC Card as in claim 68 including:

first and second spaced apart flanges extending rearwardly from said header, each of said flanges having a stepped portion defining a shoulder and a portion of reduced thickness;

said first cover abutting the shoulder of said first flange and being bonded to the reduced thickness portion of said first flange; and said second cover abutting the shoulder of said second flange and being bonded to the reduced thickness portion of said second flange.

82. A hermetically sealed PC Card as in claim 68 wherein:

said holes in said header are arranged in a pair of rows, with the holes in each row being aligned.

83. A hermetically sealed PC Card as in claim 68 wherein:

said holes in said header are arranged in a pair of rows, with the holes in each row being offset to maximize the spacing between adjacent holes.

84. A hermetically sealed PC Card as in claim 83 including:

a printed wiring board between the rearwardly facing pins of said connector and the forwardly extending pins from said header;

said printed wiring board having conductive pads, each of said pads being contacted by and electrically interconnecting one of said connector pins and one of said header pins.

* * * * *